(12) United States Patent
Shimada

(10) Patent No.: US 8,431,935 B2
(45) Date of Patent: Apr. 30, 2013

(54) SEMICONDUCTOR SUBSTRATE WITH COBALT SILICIDE BUFFER LAYER AND ITS MANUFACTURING METHOD

(75) Inventor: Hiroyuki Shimada, Chuo (JP)

(73) Assignee: Seiko Epson Corporation, Tokyo (JP)

( * ) Notice: Subject to any disclaimer, the term of this patent is extended or adjusted under 35 U.S.C. 154(b) by 312 days.

(21) Appl. No.: 12/887,005

(22) Filed: Sep. 21, 2010

(65) Prior Publication Data

US 2011/0079793 A1    Apr. 7, 2011

(30) Foreign Application Priority Data

Oct. 2, 2009  (JP) .................. 2009-230371

(51) Int. Cl.
*H01L 29/15*      (2006.01)

(52) U.S. Cl.
USPC ........ 257/78; 257/77; 257/E29.104; 438/105; 438/931

(58) Field of Classification Search ............... 257/777, 257/78

See application file for complete search history.

(56) References Cited

U.S. PATENT DOCUMENTS 6,909,146 B1 *  6/2005  Linn et al. .................. 257/347
8,080,826 B1 * 12/2011  Johnson et al. ............. 257/77

FOREIGN PATENT DOCUMENTS

JP      2003081695 A  *  3/2003
JP      A-2004-103671       4/2004

* cited by examiner

*Primary Examiner* — Ajay K Arora
(74) *Attorney, Agent, or Firm* — Oliff & Berridge, PLC

(57) ABSTRACT

A semiconductor substrate includes: a substrate having a single crystal silicon on at least one surface thereof; a buffer layer that is provided on the single crystal silicon and has at least one cobalt silicide layer primarily containing cobalt silicide; and a silicon carbide single crystal film provided on the buffer layer.

8 Claims, 1 Drawing Sheet

SEMICONDUCTOR SUBSTRATE WITH COBALT SILICIDE BUFFER LAYER AND ITS MANUFACTURING METHOD

The entire disclosure of Japanese Patent Application No. 2009-230371, filed Oct. 2, 2009 is expressly incorporated by reference herein

BACKGROUND

1. Technical Field

The invention relates to a semiconductor substrate equipped with a silicon carbide single crystal film that is expected as wide band gap semiconductor, and its manufacturing method.

2. Related Art

A silicon single crystal has a large diameter and high quality and can be manufactured at low cost, and therefore is used as a substrate for the growth of a single crystal of various materials. In particular, cubic silicon carbide (3C—SiC) is expected as a semiconductor material for low-loss power devices of the next generation, and is very advantageous as it can be grown in a single crystal (in heteroepitaxy) on an inexpensive silicon substrate.

However, there is a lattice constant difference of about 20% present between cubic silicon carbide crystal and silicon crystal, such that many voids and misfit dislocations are generated in the cubic silicon carbide crystal formed on the silicon crystal (silicon substrate), which makes it difficult to grow high quality crystals.

In this connection, Japanese Laid-open Patent Application 2004-103071 proposed a method for matching the lattice of the silicon substrate with the lattice of the cubic silicon carbide layer by inserting a cubic boron phosphide (c-BP) film between the silicon substrate and the cubic silicon carbide layer as a buffer layer for alleviating the lattice constant difference (lattice mismatch) between the silicon substrate and the cubic silicon carbide layer.

However, the melting point of c-BP is relatively low at about 1100° C., and the material including phosphorous would readily evaporate at temperatures lower than the melting point, such that it is very difficult to stably grow the buffer layer composed of c-BP on the silicon substrate. Cubic boron phosphide (c-BP) having a lattice constant of 0.4538 nm can make the lattice mismatch relatively smaller to 4.1% with respect to cubic silicon carbide (3C—SiC) having a lattice constant of 0.4358 nm, but a huge lattice mismatch of as much as 17.9% is still present between the silicon substrate (having a lattice constant of 0.5430 nm) and the cubic boron phosphide (c-BP). Therefore introduction of many defects into the c-BP film itself cannot be prevented, such that a high quality 3C—SiC single crystal film cannot be formed.

Under such circumstances, a buffer layer having a fewer lattice mismatch with respect to 3C—SiC is desired so that a sufficiently high quality single crystal film can be grown at the time of epitaxial growth of silicon carbide.

SUMMARY

In accordance with an advantage of some aspects of the invention, it is possible to provide a semiconductor substrate formed with a high grade (high quality) silicon carbide single crystal film by forming a buffer layer with a fewer lattice mismatch with respect to cubic silicon carbide (3C—SiC), and a method for manufacturing the semiconductor substrate.

In accordance with an embodiment of the invention, a semiconductor substrate includes a substrate having a single crystal silicon on at least one surface thereof, a buffer layer that is provided on the single crystal silicon and has at least one cobalt silicide layer primarily containing cobalt silicide, and a silicon carbide single crystal film that is provided on the buffer layer.

According to the semiconductor substrate, the buffer layer is formed from a cobalt silicide layer primarily containing cobalt silicide having a lattice constant in the range between 0.4447 nm (CoSi) and 0.5367 nm ($CoSi_2$). This buffer layer provides a smaller lattice constant difference (lattice mismatch) with respect to both of the single crystal silicon and the silicon carbide single crystal film. Therefore, the silicon carbide single crystal film provided on the buffer layer has a fewer lattice mismatch, and the silicon carbide single crystal film is formed at a high grade (a high quality).

In the semiconductor substrate, the cobalt silicide layer composing the buffer layer may preferably have a composition of $CoSi_x$ wherein x may preferably be 1 or more but 2 or less. As described above, the lattice constant of cobalt monosilicide (CoSi) with x being 1 is 0.4447 nm, and the lattice constant of cobalt disilicide ($CoSi_2$) with x being 2 is 0.5367 nm. Therefore, in the case of $CoSi_x$ with x being in the range between 1 and 2 ($1 \leq x \leq 2$), its lattice constant is assumed to be between 0.4447 nm and 0.5367 nm. Therefore, by adjusting x to have an appropriate value, the buffer layer can present a smaller lattice constant difference (lattice mismatch) to both of the single crystal silicon and the silicon carbide single crystal film.

Also, in the semiconductor substrate, the buffer layer may have two or more cobalt silicide layers, wherein one of the cobalt silicide layers having a composition of $CoSi_2$ may preferably be arranged on the side where the buffer layer contacts the single crystal silicon, and one of the cobalt silicide layers having a composition of CoSi may preferably be arranged on the side where the buffer layer contacts the silicon carbide single crystal film. Accordingly, $CoSi_2$ having a lattice constant of 0.5367 nm contacts the single crystal silicon having a lattice constant of 0.5430 nm, and CoSi having a lattice constant of 0.4447 nm contacts the silicon carbide single crystal film having a lattice constant of 0.4358 nm. Therefore, a smaller lattice constant difference (lattice mismatch) is present between the single crystal silicon and the buffer layer as well as between the buffer layer and the silicon carbide single crystal film.

In the semiconductor substrate, when the composition of the cobalt silicide layer forming the buffer layer is $CoSi_x$, x in the $CoSi_x$ may preferably change continuously or in stages from 1 to 2 from the side where the buffer layer is in contact with the single crystal silicon to the side where the buffer layer is in contact with the silicon carbide single crystal film. According to such a composition, a fewer lattice constant difference (lattice mismatch) is present between the single crystal silicon and the buffer layer as well as between the buffer layer and the silicon carbide single crystal film. Furthermore, x changes continuously or in stages within the cobalt silicide layer composing the buffer layer, such that the buffer layer with good quality having fewer internal defects can be provided, and the silicon carbide single crystal film provided thereon also is formed at high quality.

In the semiconductor substrate, the silicon carbide single crystal film may preferably be a single crystal film of cubic silicon carbide. By so doing, in addition to an aspect in that cobalt silicide and silicon are in the cubic crystal system, the silicon carbide single crystal film is also composed of cubic crystal, such that crystal growth of the silicon carbide single crystal film can relatively readily take place, and therefore the silicon carbide single crystal film can be formed at high quality.

In accordance with an embodiment of the invention, a method for manufacturing a semiconductor substrate includes the steps of: forming, on a substrate containing single crystal silicon on at least one surface thereof, a buffer layer by providing one or more layers of cobalt silicide primarily containing cobalt silicide on the single crystal silicon, and forming a silicon carbide single crystal film on the buffer layer.

According to the method for manufacturing a semiconductor substrate, the buffer layer is formed from a cobalt silicide layer primarily containing cobalt silicide having a lattice constant in the range between 0.4447 nm (CoSi) and 0.5367 nm ($CoSi_2$). This buffer layer provides a smaller lattice constant difference (lattice mismatch) with respect to both of the single crystal silicon and the silicon carbide single crystal film. Therefore, the silicon carbide single crystal film provided on the buffer layer has a fewer lattice mismatch, and the silicon carbide single crystal film is formed at high grade (high quality). Further, the silicon and the cobalt silicide are both in the cubic crystal system, such that crystal growth of the buffer layer on the single crystal silicon can be relatively readily conducted, and therefore the buffer layer can be formed at high quality with fewer defects.

In the method for manufacturing a semiconductor substrate, in the step of forming the buffer layer, the cobalt silicide layer composing the buffer layer may preferably have a composition of $CoSi_x$, wherein the buffer layer may preferably be formed with x being 1 or more but 2 or less. As described above, when x in the composition $CoSi_x$ is in the range between 1 and 2 ($1 \leq x \leq 2$), a mixed crystal is assumed to be formed with its lattice constant ranging between 0.4447 nm and 0.5367 nm. Therefore, by forming the buffer layer in a manner that x has an appropriate value in the range between 1 and 2, the buffer layer can be made with a smaller lattice constant difference (lattice mismatch) to both of the single crystal silicon and the silicon carbide single crystal film.

Also, in the method for manufacturing a semiconductor substrate, in the step of forming the buffer layer, a cobalt silicide layer having a composition of $CoSi_2$ may preferably be formed on the side where the buffer layer contacts the single crystal silicon, and a cobalt silicide layer having a composition of CoSi may preferably be formed on the side where the buffer layer contacts the silicon carbide single crystal film. As a result, the buffer layer can be formed with a fewer lattice constant difference (lattice mismatch) being present between the single crystal silicon and the buffer layer as well as between the buffer layer and the silicon carbide single crystal film.

In the method for manufacturing a semiconductor substrate, in the step of forming the buffer layer, when the composition of the cobalt silicide layer forming the buffer layer is $CoSi_x$, the buffer layer may preferably be formed such that x in the $CoSi_x$ changes continuously or in stages from 1 to 2 from the side where the buffer layer is in contact with the single crystal silicon to the side where the buffer layer is in contact with the silicon carbide single crystal film. By so doing, the buffer layer can be formed with a fewer lattice constant difference (lattice mismatch) being present between the single crystal silicon and the buffer layer as well as between the buffer layer and the silicon carbide single crystal film. Furthermore, x is changed continuously or in stages within the cobalt silicide layer composing the buffer layer, such that the buffer layer with good quality having fewer internal defects can be formed, and a high quality silicon carbide single crystal film can be formed on the buffer layer.

In the method for manufacturing a semiconductor substrate, in the step of forming the silicon carbide single crystal film, a single crystal film of cubic silicon carbide may preferably be formed. By so doing, in addition to an aspect in that the crystal systems of cobalt silicide and silicon are the cubic crystal system, the silicon carbide single crystal film is also composed of cubic crystal, such that crystal growth of the silicon carbide single crystal film can be relatively readily conducted, and therefore the silicon carbide single crystal film can be formed at high quality.

DESCRIPTION OF EXEMPLARY EMBODIMENTS

A semiconductor substrate and its manufacturing method in accordance with embodiments of the invention are described below with reference to the accompanying drawings. It is noted that, in each of the drawings used for the following description, the scale of each illustrated member may be suitably changed so that the member has a size that is recognizable.

Figure 1:
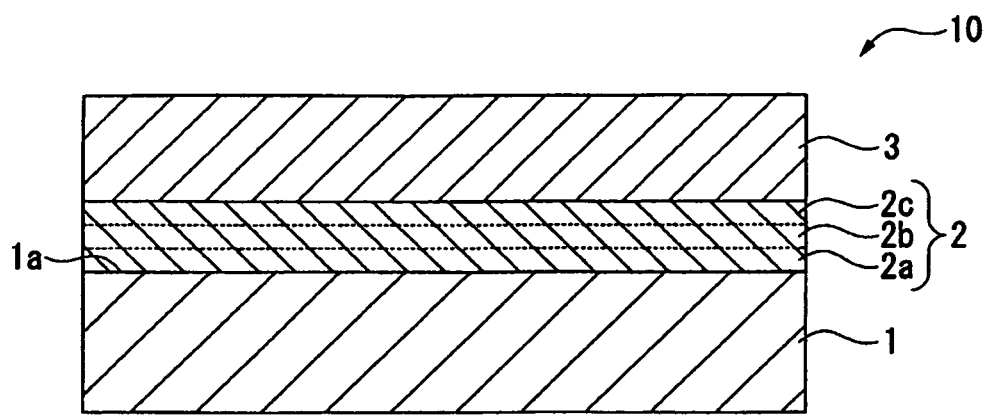
FIG. 1 is a side cross-sectional view of a semiconductor substrate in accordance with an embodiment of the invention.

First, a semiconductor substrate in accordance with an embodiment of the invention is described. FIG. 1 is a cross-sectional view of a semiconductor substrate in accordance with an embodiment of the invention. Reference numeral 1 in FIG. 1 denotes a semiconductor substrate 10. The semiconductor substrate 10 is formed from a single crystal silicon substrate (hereafter referred to as a silicon substrate) 1, a buffer layer 2 formed on one surface 1a of the silicon substrate 1, and a silicon carbide single crystal film 3 formed on the buffer layer 2.

The silicon substrate 1 in accordance with an aspect of the invention is a substrate having single crystal silicon at its one surface 1a. The crystal plane of single crystal silicon exposed at the one surface 1a of the silicon substrate may be, for example, a crystal plane expressed by Miller index (100) (hereafter simply referred to as (100) plane), but may be a plane other than the (100) plane, such as, for example, a (111) plane that is inclined at 54.73° with respect to the (100) plane. Such single crystal silicon is in a cubic crystal system, and its lattice constant is 0.5430 nm.

TABLE 1

|  | Crystal system | Crystal structure | Lattice constant | Forming temperature | Melting point |
|---|---|---|---|---|---|
| 3C—SiC | Cubic | Sphalerite | 0.4358 nm | >1000° C. | >2000° C.* |
| CoSi | Cubic | Sphalerite | 0.4447 nm | >400° C. | 1460° C. |
| $CoSi_2$ | Cubic | Fluorite | 0.5367 nm | >600° C. | 1326° C. |
| Si | Cubic | Diamond | 0.5430 nm | — | 1416° C. |

*sublimation

The buffer layer 2 includes one or more cobalt silicide layers primarily containing cobalt silicide, and is formed to a thickness of for example, about 2 nm or more but about 30 nm or less. It is noted that the terms "primarily containing cobalt silicide" mean that the cobalt silicide layer may contain impurity other than cobalt silicide, as long as the layer is formed from cobalt silicide as the primary constituent.

In accordance with the present embodiment, as shown in FIG. 1, the buffer layer 2 has a three-layer structure in which a first cobalt silicide layer 2a, a second cobalt silicide layer 2b and a third cobalt silicide layer 2c are sequentially laminated from the side of the silicon substrate 1. However, it is noted that clearly defined borders do not exist among these layers. When the composition of cobalt silicide is $CoSi_x$, the border here may be defined as a border between adjacent ones of the layers formed with different values x in the following conditions.

Specifically, the first cobalt silicide layer 2a in contact with the silicon substrate 1 is a layer in which the value x is 2, in other words, a layer composed of $CoSi_2$ (cobalt disilicide). The second cobalt silicide layer 2b is a layer in which the value x is in the range of more than 1 but less than 2, in other words, a layer composed of $CoSi_x$ (1<x<2). The third cobalt silicide layer 2c in contact with the silicon carbide single crystal film 3 is a layer in which the value x is 1, in other words, a layer composed of CoSi (cobalt monosilicide). As shown in the table above, the crystal systems of $CoSi_2$ (cobalt disilicide) and CoSi (cobalt monosilicide) are both the cubic crystal system, and their lattice constants of $CoSi_2$ and CoSi are 0.5367 nm and 0.4447 nm, respectively.

Also, the second cobalt silicide layer 2b is formed in a manner that the value x in the composition thereof changes continuously or in stages from 2 to 1 from the first cobalt silicide layer 2a to the third cobalt silicide layer 2c. In particular, when the second cobalt silicide layer 2b is formed in a manner that the value x continuously changes from 2 to 1, clearly defined borders are not present among the cobalt silicide layers 2a, 2b and 2c. On the other hand, when the second cobalt silicide layer 2b is formed in a manner that the value x changes from 2 to 1 in stages, the cobalt silicide layer 2b is further divided into a plurality of cobalt silicide thinner layers.

In accordance with the present embodiment, the cobalt silicide layers composing the buffer layer 2 are defined by three cobalt silicide layers 2a, 2b and 2c by changing the value x described above. It is noted that, in the buffer layer 2 in which the value x ranges between 1 and 2, $CoSi_x$ presents a mixed crystal state in which $CoSi_2$ (cobalt disilicide) and CoSi (cobalt monosilicide) are present in a mixed state. Therefore, according to the ratio between these crystals, in other words, according to the value x, the lattice constant of $CoSi_x$ is assumed to change. Also, its crystal system is the cubic crystal system.

The silicon carbide single crystal film 3 is a single crystal layer of silicon carbide that is epitaxially grown on the buffer layer 2. The silicon carbide single crystal film 3 is formed from cubic silicon carbide (3C—SiC) in accordance with the present embodiment. Cubic silicon carbide has a high band gap value of 2.2 eV, such that its light transmissivity and dielectric breakdown electric filed are high, and therefore cubic silicon carbide is suitably used as wide band gap semiconductor for power devices. The silicon carbide single crystal film 3 composed of such 3C—SiC has a lattice constant of 0.4358 nm, as shown in the table above.

In the semiconductor substrate 10 having the structure described above, the buffer layer 2 is formed from the cobalt silicide layers 2a-2c whose lattice constant ranges between 0.4447 nm (CoSi) and 0.5367 nm ($CoSi_2$), such that the buffer layer 2 presents a fewer lattice constant difference (lattice mismatch) to both of the silicon substrate (single crystal silicon film) 1 and the silicon carbide single crystal film 3.

In other words, the lattice mismatch between the silicon substrate 1 and the first cobalt silicide ($CoSi_2$) 2a is reduced to as low as 1.2%, compared to the case where cubic boron phosphide (c-BP) is used, and the lattice mismatch between the third cobalt silicide (CoSi) 2c and the silicon carbide single crystal film 3 is also sufficiently reduced to as low as 2.0%©. Therefore, the silicon carbide single crystal film 3 formed on the buffer layer 2 is formed at high grade (high quality) with fewer lattice mismatch.

Also, because the first cobalt silicide layer 2a is arranged in contact with the silicon substrate 1, and the third cobalt silicide layer 2c is arranged in contact with the silicon carbide single crystal film 3, $CoSi_2$ whose lattice constant is 0.5367 nm is in contact with the silicon substrate 1 whose lattice constant is 0.5430 nm, and CoSi whose lattice constant is 0.4447 nm is in contact with the silicon carbide single crystal film (3C—SiC) whose lattice constant is 0.4358 nm. Therefore, the lattice constant difference (lattice mismatch) is reduced to a smaller level between the silicon substrate 1 and the buffer layer 2 and between the buffer layer 2 and the silicon carbide single crystal film 3, and the silicon carbide single crystal film 3 is formed at high grade (high quality).

Furthermore, because the buffer layer 2 is formed from the first-third cobalt silicide layers 2a-2c, and the value x in $CoSi_x$ is changed continuously or in stages from 1 to 2 from the side of the silicon substrate 1 toward the side of the silicon carbide single crystal film 3, lattice mismatch within the buffer layer 2 is also reduced. Accordingly, as the buffer layer 2 is formed at good quality with fewer internal defects, the silicon carbide single crystal film 3 is formed even at higher grade (higher quality).

Figure 2:
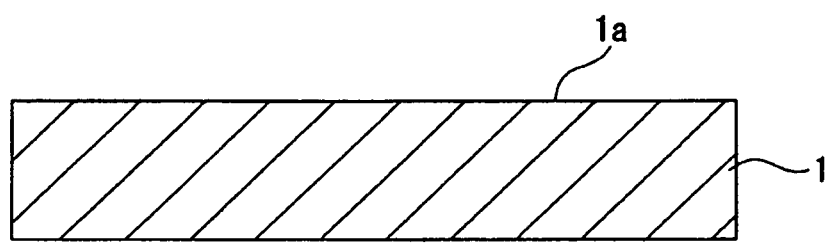
FIG. 2 is a cross-sectional view for describing a step in a method for manufacturing a semiconductor substrate shown in FIG. 1.

Next, based the semiconductor substrate 1 manufactured in a manner described above, a method for manufacturing a semiconductor substrate in accordance with an embodiment of the invention will be described below. First, as shown in FIG. 2, a silicon substrate 1 is prepared. Then, a naturally formed oxide film on one surface 1a of the silicon substrate 1 is removed (washed). Removal of the naturally formed oxide film may be conducted as follows. For example, the silicon substrate 1 is placed in a vacuum chamber, and an anneal treatment is applied to the substrate in a reduced-pressure atmosphere, thereby removing the naturally formed oxide film ($SiO_2$) adhered to the one surface 1a.

The anneal treatment may be conducted by, for example, heating the silicon substrate 1 at 750° C. for about five minutes. In this instance, the naturally formed oxide film may be removed from the one surface 1a of the silicon substrate 1 by, for example, introducing hydrogen gas in the vacuum chamber, and causing hydrogen gas reacted with the naturally formed oxide film. Moreover, in place of the anneal treatment, the one surface 1a of the silicon substrate 1 may be etched in advance with etching liquid such as hydrofluoric acid (HF) or the like, thereby removing the naturally formed oxide film.

Figure 3:
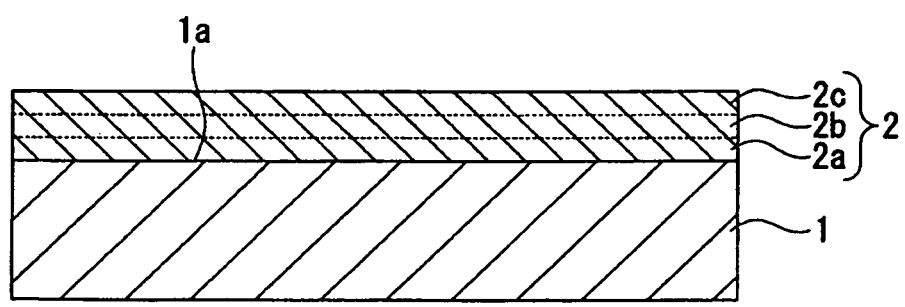
FIG. 3 is a cross-sectional view for describing a step succeeding the step shown in FIG. 2.

Next, the silicon substrate 1 is introduced in a CVD chamber, a vacuum is drawn in the CVD chamber, and the silicon substrate 1 is heated to elevate its temperature to 900° C. Then, in this state, bis (cyclopentadienyl) cobalt gas at a flow rate of 1.0 sccm and disilane gas at a flow rate of 2.0 sccm are supplied as source material gas in the CVD chamber. This state is maintained for 10 minutes, whereby a first cobalt silicide layer 2a ($CoSi_2$) is formed, as shown in FIG. 3. The $CoSi_2$ layer is a stable layer at high temperatures, and therefore it can be favorably formed by maintaining the substrate temperature in a high temperature region.

Then, the supply flow rate of disilane gas is continuously reduced, while the temperature of the silicon substrate 1 is continuously lowered. Then, because CoSi has a lower forming temperature compared to that of $CoSi_2$, as shown in the table above, the value x becomes gradually lowered from 2 to 1 in the composition defined by $CoSi_x$. In other words, the composition defined by $CoSi_x$ continuously changes from $CoSi_2$ to CoSi, from the side of the first cobalt silicide layer 2a to the side of the third cobalt silicide layer 2c shown in FIG. 1.

Finally, the temperature of the silicon substrate 1 is lowered to 500° C., and the flow rate of bis (cyclopentadienyl) cobalt gas is maintained at 1.0 sccm and the flow rate of disilane gas is reduced to 1.0 sccm. This state is maintained for, for example, ten minutes. By adjusting the substrate temperature and the flow rate of source material gas, in other words, by continuously lowering the substrate temperature and the flow rate, a second cobalt silicide layer 2b ($CoSi_x$:1<x<2) is formed, as shown in FIG. 3, and then when the temperature of the silicon substrate 1 is thereafter lowered to 500° C., a third cobalt silicide layer 2c (CoSi) is formed. In other words, by lowering the substrate temperature with respect to the forming condition to form $CoSi_2$, and adjusting the ratio between the silicon source gas (disilane gas) and the cobalt source gas (bis (cyclopentadienyl) cobalt gas) to optimum values, CoSi that is stable in a low temperature range can be formed.

It is noted that, when forming the second cobalt silicide layer 2b, instead of continuously lowering the substrate temperature and the flow rate, the substrate temperature and the flow amount may be lowered little by little in stages. By so doing, the second cobalt silicide layer 2b has a laminate structure formed from a plurality of cobalt silicide layers whose value x in $CoSi_x$ changes in stages, such as, a cobalt silicide layer composed of $CoSi_{1.8}$, a cobalt silicide layer composed of $CoSi_{1.6}$, a cobalt silicide layer composed of $CoSi_{1.4}$, . . . .

After forming the buffer layer 2 composed of the first cobalt silicide layer 2a, the second cobalt silicide layer 2b and the third cobalt silicide layer 2c in this manner, the silicon substrate 1 with the buffer layer 2 formed thereon is cooled once to room temperature, and then the substrate temperature is elevated to 500° C., and monomethyl silane is supplied as source material gas in the chamber at a flow rate of 3.0 sccm. Then, the substrate temperature is gradually elevated to 1050° C., and this state is maintained thereafter for a predetermined period of time.

By this, cubic silicon carbide (3C—SiC) is epitaxially grown to a desired thickness on the buffer layer 2, as shown in FIG. 1, thereby forming a single crystal film 3 on the buffer layer 2. In this manner, a semiconductor substrate 10 having the single crystal film 3 of cubic silicon carbide (3C—SiC) formed over the silicon substrate 1 through the buffer layer 2 is obtained.

The temperature of the silicon substrate 1 may be elevated to a temperature at which monomethyl silane, the source material gas, can be thermally decomposed, for example between 500° C. and 1200° C. Also, monomethyl silane ($SiH_3CH_3$) that is used as the source material gas for the single crystal film 3 contains silicon atoms and carbon atoms in its molecules, such that monomethyl silane can form a silicon carbide film by itself.

Also, as the composition ratio between silicon atoms and carbon atoms is 1:1, the composition ratio of the silicon carbide single crystal film can be favorably controlled better, compared to the case where other gas, such as, for example, dimethyl silane, trimethyl silane or the like is used. Furthermore, because monomethyl silane is thermally decomposed at relatively lower temperatures, it is less likely that crystal defects newly occur due to a difference in thermal expansion coefficient between the single crystal film 3 and the silicon substrate 1 when returning the silicon substrate 1 to room temperature after the single crystal film 3 has been formed.

When the semiconductor substrate 10 in which the single crystal film 3 of cubic silicon carbide (3C—SiC) is formed on the silicon substrate 1 is completed by the method described above, the semiconductor substrate 10 can be shipped out as is as a semiconductor substrate for power devices. Also, a cubic gallium nitride layer that readily matches in lattice with the single crystal film 3 may be further grown on the semiconductor substrate 10, whereby a gallium nitride semiconductor device may be manufactured.

According to the method for manufacturing the semiconductor substrate 10 described above, the buffer layer 2 is formed by a cobalt silicide layer whose lattice constant ranges between 0.4447 nm (CoSi) and 0.5367 nm ($CoSi_2$), such that the buffer layer 2 presents a smaller lattice constant difference (lattice mismatch) to both of the silicon substrate 1 and the silicon carbide single crystal film 3. Accordingly, the buffer layer 2 with fewer defects can be formed, and the silicon carbide single crystal film 3 with fewer lattice mismatches can be formed on the buffer layer 2. Therefore the silicon carbide single crystal film 3 can be formed at high grade (high quality). Also, as the crystal systems of silicon and cobalt silicide are both the cubic crystal system, crystal growth of the buffer layer 2 on the silicon substrate 1 is relatively easy, and therefore the buffer layer 2 can be formed at high grade with fewer defects.

Also, because the first cobalt silicide layer 2a is formed in contact with the silicon substrate 1, and the third cobalt silicide layer 2c is formed in contact with the silicon carbide single crystal film 3, $CoSi_2$ whose lattice constant is 0.5367 nm is in contact with the silicon substrate 1 whose lattice constant is 0.5430 nm, and CoSi whose lattice constant is 0.4447 nm is in contact with the silicon carbide single crystal film (3C—SiC) 3 whose lattice constant is 0.4358 nm. Therefore, the lattice constant difference (lattice mismatch) can be reduced to a smaller level both between the silicon substrate 1 and the buffer layer 2 and between the buffer layer 2 and the silicon carbide single crystal film 3, and the silicon carbide single crystal film 3 can be formed at high grade (high quality).

Moreover, the buffer layer 2 is formed from the first-third cobalt silicide layers 2a-2c, in which the value x in $CoSi_x$ is changed continuously or in stages from 1 to 2 from the side of the silicon substrate 1 to the side of the silicon carbide single crystal film 3, such that lattice mismatches in the buffer layer 2 can also be reduced. Therefore, the buffer layer 2 can be formed with good quality with fewer internal defects, and the high-grade silicon carbide single crystal film 3 can be formed on the buffer layer 2.

It is noted that the invention is not limited to the embodiments described above, and many modifications can be made within the range that does not depart from the subject matter of the invention. For example, a single crystal silicon substrate is used as a substrate in accordance with the embodiment of the invention, but the substrate may be formed with a single crystal silicon film formed on a substrate composed of, for example, quartz, glass, plastic material, stainless steel or the like.

Furthermore, in accordance with the embodiment described above, the buffer layer 2 is formed from three cobalt silicide layers 2a-2c. However, the invention is not limited to this embodiment, and the buffer layer 2 may be formed from a single layer or two layers, or four or more layers of cobalt silicide.

What is claimed is:

1. A semiconductor substrate comprising:
    a substrate having a single crystal silicon, at least one surface of the single crystal silicon being a surface of the substrate;
    a buffer layer that is provided on the single crystal silicon and includes at least two cobalt silicide layers each containing cobalt silicide; and
    a silicon carbide single crystal film provided on the buffer layer, wherein
    one of the cobalt silicide layers having a composition of $CoSi_2$ is arranged on a side of the buffer layer that is in contact with the single crystal silicon, and one of the cobalt silicide layers having a composition of CoSi is arranged on a side of the buffer layer that is in contact with the silicon carbide single crystal film.

2. A semiconductor substrate according to claim 1, wherein the cobalt silicide layer composing the buffer layer has a composition of $CoSi_x$ where x is 1 or more but 2 or less.

3. A semiconductor substrate according to claim 1, wherein the silicon carbide single crystal film is a single crystal film of cubic silicon carbide.

4. A semiconductor substrate comprising:
    a substrate having a single crystal silicon, at least one surface of the single crystal silicon being a surface of the substrate;
    a buffer layer that is provided on the single crystal silicon and has at least one cobalt silicide layer containing cobalt silicide; and
    a silicon carbide single crystal film provided on the buffer layer, wherein
    the cobalt silicide layer composing the buffer layer has a composition of $CoSi_x$, wherein x in $CoSi_x$ changes continuously or in stages from 1 to 2 from the side where the buffer layer is in contact with the single crystal silicon to the side where the buffer layer is in contact with the silicon carbide single crystal film.

5. A method for manufacturing a semiconductor substrate, comprising the steps of:
    forming, on a substrate having single crystal silicon on at least one surface thereof, a buffer layer of at least two layers of cobalt silicide each primarily containing cobalt silicide on the single crystal silicon; and
    forming a silicon carbide single crystal film on the buffer layer, wherein,
    in the step of forming the buffer layer, a cobalt silicide layer having a composition of $CoSi_2$ is formed on the side where the buffer layer contacts the single crystal silicon, and a cobalt silicide layer having a composition of CoSi is formed on the side where the buffer layer contacts the silicon carbide single crystal film.

6. A method for manufacturing a semiconductor substrate according to claim 5, wherein the buffer layer is formed such that the cobalt silicide layer composing the buffer layer has a composition of $CoSi_x$ with x being 1 or more but 2 or less.

7. A method for manufacturing a semiconductor substrate according to claim 5, wherein, in the step of forming the silicon carbide single crystal film, a single crystal film of cubic silicon carbide is formed.

8. A method for manufacturing a semiconductor substrate, comprising the steps of:
    forming, on a substrate having single crystal silicon on at least one surface thereof, a buffer layer of at least one layer of cobalt silicide primarily containing cobalt silicide on the single crystal silicon; and
    forming a silicon carbide single crystal film on the buffer layer, wherein
    the composition of the cobalt silicide layer forming the buffer layer is $CoSi_x$, and the buffer layer is formed such that x in the $CoSi_x$ changes continuously or in stages from 1 to 2 from a side of the buffer layer that is in contact with the single crystal silicon to another side of the buffer layer that is in contact with the silicon carbide single crystal film.

* * * * *